United States Patent
Sorimachi

(10) Patent No.: US 8,581,285 B2
(45) Date of Patent: Nov. 12, 2013

(54) SEMICONDUCTOR LIGHT-EMITTING ELEMENT FOR FLIP-CHIP MOUNTING

(75) Inventor: Kazuaki Sorimachi, Saitama (JP)

(73) Assignees: Citizen Holdings Co., Ltd., Tokyo (JP); Citizen Electronics Co., Ltd., Yamanashi (JP)

( * ) Notice: Subject to any disclaimer, the term of this patent is extended or adjusted under 35 U.S.C. 154(b) by 143 days.

(21) Appl. No.: 13/117,555

(22) Filed: May 27, 2011

(65) Prior Publication Data

US 2011/0291141 A1 Dec. 1, 2011

(30) Foreign Application Priority Data

May 28, 2010 (JP) ................................ 2010-122760

(51) Int. Cl.
*H01L 23/48* (2006.01)
(52) U.S. Cl.
USPC ... 257/98; 257/99; 257/E33.068; 257/E33.072; 438/109
(58) Field of Classification Search
USPC ............ 257/94, 99, E21.002, E33.066, 257/E33.072, 98, E33.068; 438/109
See application file for complete search history.

(56) References Cited

U.S. PATENT DOCUMENTS

| | | | | |
|---|---|---|---|---|
| 5,134,460 | A * | 7/1992 | Brady et al. | 257/737 |
| 6,989,326 | B2 * | 1/2006 | Tong et al. | 438/614 |
| 7,109,529 | B2 * | 9/2006 | Uemura et al. | 257/99 |
| 7,355,212 | B2 | 4/2008 | Okazaki et al. | |
| 7,495,304 | B2 * | 2/2009 | Lin et al. | 257/432 |
| 2006/0081869 | A1 | 4/2006 | Lu et al. | |
| 2007/0023919 | A1 * | 2/2007 | Lin et al. | 257/774 |
| 2009/0173956 | A1 * | 7/2009 | Aldaz et al. | 257/94 |
| 2009/0206476 | A1 * | 8/2009 | Su | 257/737 |

FOREIGN PATENT DOCUMENTS

| | | |
|---|---|---|
| JP | 11-191641 | 7/1999 |
| JP | 2002-26392 | 1/2002 |
| JP | 2006-121084 | 5/2006 |

* cited by examiner

*Primary Examiner* — John C Ingham
(74) *Attorney, Agent, or Firm* — Finnegan, Henderson, Farabow, Garrett & Dunner, L.L.P.

(57) ABSTRACT

The present invention is directed to the provision of a semiconductor light-emitting element that has an electrode formed with a desired thickness using a plated metal layer. A semiconductor light-emitting element for flip-chip mounting on a circuit substrate includes a semiconductor layer including a light-emitting layer, an N-side bump electrode for connecting the semiconductor layer to the circuit substrate, and a P-type bump electrode for connecting the semiconductor layer to the circuit substrate, wherein the N-side bump electrode and the P-type bump electrode each include an under-bump metal layer and a plated metal layer, the under-bump metal layer includes a high-reflectivity metal layer disposed on a side that faces the semiconductor layer and a metal layer disposed on a side opposite from the semiconductor layer, and the plated metal layer has a thickness not less than 3 μm but not greater than 30 μm.

8 Claims, 8 Drawing Sheets

SEMICONDUCTOR LIGHT-EMITTING ELEMENT FOR FLIP-CHIP MOUNTING

The entire content of Japanese Patent Application No. 2010-122760 is hereby incorporated by reference.

FIELD OF THE INVENTION

The present invention relates to a semiconductor light-emitting element for flip-chip mounting.

BACKGROUND OF THE INVENTION

In many cases, a semiconductor light-emitting element (hereinafter referred to as an LED element unless specifically stated otherwise) is mounted in a face-up fashion or in a flip-chip (also referred to as face-down) fashion on a circuit substrate of a semiconductor light-emitting device (hereinafter referred to as an LED device unless specifically stated otherwise) for packaging. In the face-up mounting, the LED element is placed on the circuit substrate with the electrode side of the LED element facing up, and the electrodes of the LED element are connected to the electrodes on the circuit substrate by wires. On the other hand, in the flip-chip mounting, the LED element is placed on the circuit substrate with the electrode side of the LED element facing down, and the electrodes of the LED element are connected to the electrodes on the circuit substrate by electrically conductive contacts such as bumps.

Since the LED element is directly connected to the circuit substrate by means of bumps or the like, the flip-chip mounting offers the advantages of being able to enhance heat-sinking efficiency and to reduce the mounting area because of the elimination of the need for wires. To improve the light-emitting efficiency of the flip-chip mounting LED element, a reflective layer may be provided on the electrode side as viewed from the light-emitting layer so that the light emitted from the light-emitting layer and directed toward the circuit substrate may be reflected by the reflective layer and caused to emerge from the LED device.

For example, it is known to provide a semiconductor light-emitting element which comprises a semiconductor layer deposited on a crystal substrate and an n-side electrode and p-side electrode for connecting the semiconductor layer to an Si diode device, wherein the p-side electrode includes a reflective layer (for example, patent document 1). The n-side electrode and the p-side electrode have micro-bumps for connecting to the Si diode device.

It is also known to provide a flip-chip light-emitting diode which comprises a semiconductor layer deposited on a transparent substrate and a first electrode and second electrode for connecting the semiconductor layer to a packaging submount, wherein the first electrode includes a metal reflective layer (for example, patent document 2). The first electrode and the second electrode are each connected to the packaging submount via an intermediate layer formed from a solderable material.

Furthermore, it is known to provide a semiconductor light-emitting element which comprises a semiconductor layer deposited on a sapphire substrate and an n-type electrode and p-type electrode for connecting the semiconductor layer to a submount, wherein the n-type and p-type electrodes each include an Al layer (for example, patent document 3). Each of the n-type and p-type electrodes further includes an Au layer that serves as an overcoat electrode for enhancing adhesion to the submount.

Patent document 1: JP H11-191641-A (FIG. 1)
Patent document 2: JP 2006-121084-A (FIG. 3)
Patent document 3: JP 2002-26392-A (FIG. 2)

SUMMARY OF THE INVENTION

The flip-chip semiconductor light-emitting element is connected to a board, etc., with its light-emitting layer facing down; here, in order to enhance mounting efficiency, it is important that a prescribed gap be provided between the board and the semiconductor light-emitting element. Further, even when fine dust, etc. are present on the board, the effects of such dust can be alleviated by connecting the semiconductor light-emitting element to the board with a prescribed gap provided therebetween. One possible method to accomplish this would be to form the connecting electrodes from thick film.

Generally, the film thickness formed by sputtering or vacuum evaporation is about 1 µm or less. If a film with a thickness of 1 µm or greater is to be formed by sputtering, residual stress in the film will become too great, which is not desirable. On the other hand, if a film with a thickness of 1 µm or greater is to be formed by vacuum evaporation, difficulties will arise due to constraints of the manufacturing time, material utilization, and equipment.

However, it is not known in the prior art to provide a semiconductor light-emitting element that has a desired thickness and yet ensures high light utilization in a simple and easy manner.

Accordingly, it is an object of the present invention to provide a semiconductor light-emitting element that can solve the above problem.

It is also an object of the present invention to provide a semiconductor light-emitting element that has an electrode formed with a desired thickness using a plated metal layer.

A semiconductor light-emitting element for flip-chip mounting on a circuit substrate includes, a semiconductor layer including a light-emitting layer, an N-side bump electrode for connecting the semiconductor layer to the circuit substrate, and a P-type bump electrode for connecting the semiconductor layer to the circuit substrate, wherein the N-side bump electrode and the P-type bump electrode each include an under-bump metal layer and a plated metal layer, the under-bump metal layer includes a high-reflectivity metal layer disposed on a side that faces the semiconductor layer and a metal layer disposed on a side opposite from the semiconductor layer, and the plated metal layer has a thickness not less than 3 µm but not greater than 30 µm.

Preferably, in the semiconductor light-emitting element, the plated metal layer has a thickness not less than 10 µm but not greater than 30 µm.

Preferably, in the semiconductor light-emitting element, the high-reflectivity metal layer is an Al layer or an Ag layer.

Preferably, in the semiconductor light-emitting element, the N-side bump electrode and the P-type bump electrode have the same plan shape as the under-bump metal layers included in the N-side bump electrode and the P-type bump electrode, respectively.

Preferably, in the semiconductor light-emitting element, the under-bump metal layer occupies an area larger than the area occupied by the plated metal layer.

Preferably, the semiconductor light-emitting element further includes a protective layer for covering the semiconductor layer, the protective layer having openings formed therein, wherein the N-side bump electrode and the P-type bump electrode are respectively connected electrically to the semiconductor layer at the openings.

Preferably, in the semiconductor light-emitting element, the N-side bump electrode is disposed so as to overlap with the light-emitting layer at a height direction.

Preferably, in the semiconductor light-emitting element, the metal layer is a metal layer for preventing atomic diffusion.

Since the electrodes are formed with a desired thickness, the semiconductor light-emitting element has the advantage of being less susceptible to such effects as dust and the stress applied to the light-emitting layer.

According to the semiconductor light-emitting element, the electrodes of the desired thickness can be easily formed because of the use of electrolytic plating.

According to the semiconductor light-emitting element, a reflective layer can be formed simultaneously with the formation of the under-bump metal layer in each of the P-side and N-side bump electrodes, and the reflective efficiency can be enhanced by thus providing each of the P-side and N-side bump electrodes with the reflective layer.

According to the semiconductor light-emitting element, since the light emitted from the light-emitting layer and directed toward the bump electrode is highly efficiently reflected by the high-reflectivity metal layer in the under-bump metal layer, the mounting efficiency of the LED device can be enhanced.

Furthermore, according to the semiconductor light-emitting element, if a wafer having no reflective layers is provided, an LED element having a reflective layer can be easily produced by just forming a high-reflectivity metal layer as the lowermost layer of the plating electrode (also called the common electrode) indispensable to the electrolytic plating step.

DESCRIPTION OF THE DRAWINGS

These and other features and advantages of the present invention will be better understood by reading the following detailed description, taken together with the drawings wherein.

DETAILED DESCRIPTION OF THE PREFERRED EMBODIMENT

Figure 1:
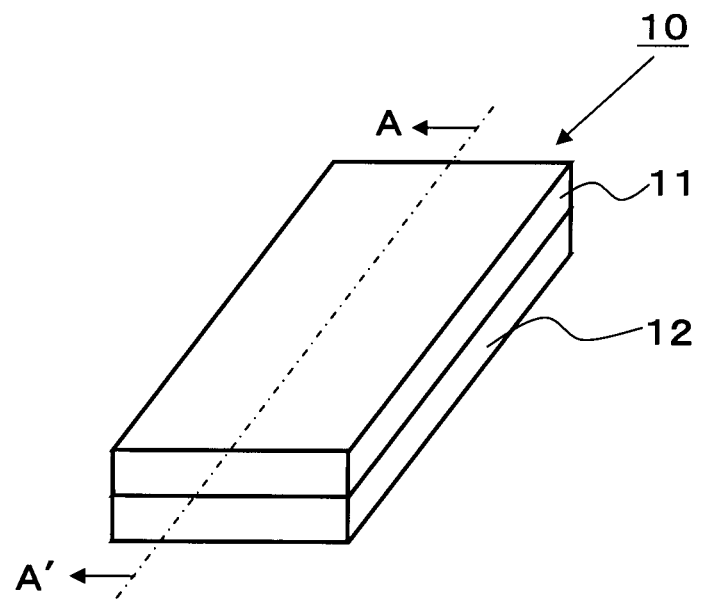
FIG. 1 is a perspective view of an LED device.

A semiconductor light-emitting element will be described below with reference to the drawings. It should, however, be noted that the technical scope of the present invention is not limited to the specific embodiments described herein, but extends to the inventions described in the appended claims and their equivalents. Throughout the drawings, the same or corresponding component elements are designated by the same reference numerals, and the description of such component elements, once given, will not be repeated thereafter. Further, for illustrative purposes, the component elements are not necessarily drawn to scale.

FIG. 1 is a perspective view showing the external appearance of an LED device 10 (a semiconductor light-emitting device).

As shown in FIG. 1, the LED device 10 is constructed by depositing a resin layer 11 on a circuit substrate 12. The resin layer 11 is formed from a phosphor-containing silicone resin having a thickness of about 400 μm.

Figure 2:
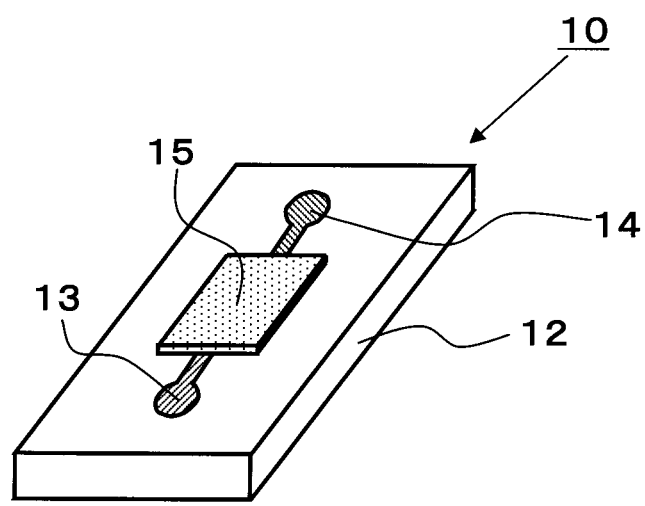
FIG. 2 is a perspective view showing the condition in which a resin layer 11 is removed from the LED device of FIG. 1.

FIG. 2 is a perspective view showing the condition in which the resin layer 11 is removed from the LED device 10 of FIG. 1. Referring to FIG. 2, a description will be given of how an LED element 15 (a semiconductor light-emitting element) is mounted.

As shown in FIG. 2, a negative electrode 14 and a positive electrode 13 are formed on the circuit substrate 12. The LED element 15 is flip-chip mounted on the electrodes. An N-side bump electrode (cathode electrode, not shown) and a P-side bump electrode (anode electrode, not shown) of the LED element 15 are connected to the negative electrode 14 and the positive electrode 13, respectively. The circuit substrate 12 is formed from a 300-μm thick alumina plate having an alumina surface. The negative and positive electrodes 14 and 13 are formed from copper foil with a thickness of about 10 to 20 μm and with nickel and gold deposited thereon. The circuit substrate 12 is provided on its underside with electrodes (not shown) for connecting to a mother substrate, and the electrodes are connected to the negative and positive electrodes 14 and 13 via through-holes (not shown). Each through-hole has a diameter of 200 μm and is filled with copper paste.

Figure 3:
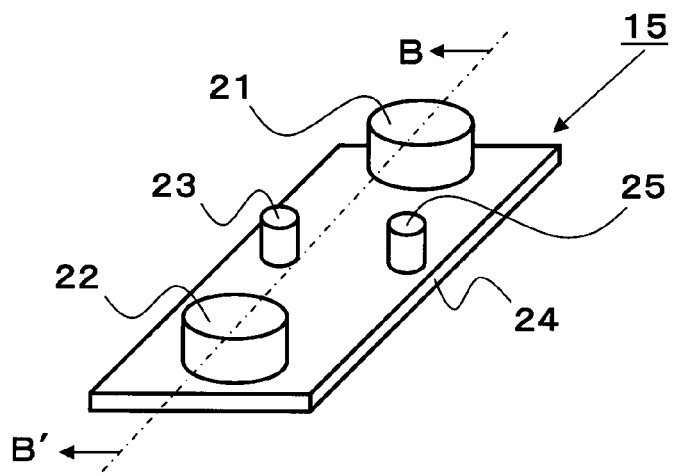
FIG. 3 is a perspective view showing an LED element 15 in FIG. 2 as viewed from the bump side thereof.

FIG. 3 is a perspective view showing the LED element 15 as viewed from the bump side thereof. The electrode side (hereinafter called the bump side) of the LED element 15 will be described with reference to FIG. 3.

As shown in FIG. 3, the N-side and P-side bump electrodes 21 and 22 and heat-sink bumps 23 and 25 are provided on a die 24 of the LED element 15. The N-side and P-side bump electrode 21 and 22 are each formed in a region where a protective layer (not shown) is perforated for wire bonding when mounting the die 24 face up. The heat-sink bump 23 is formed on the surface protective layer of the die 24 so that the heat generated by the LED element 15 can be readily transferred to the circuit substrate 12 (not shown in FIG. 3).

Figure 4:
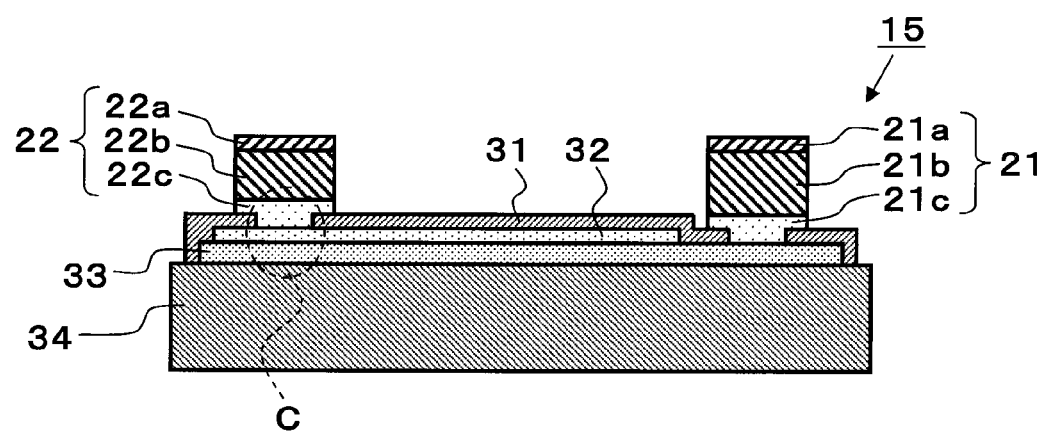
FIG. 4 is a diagram showing a BB' cross section of FIG. 3.

FIG. 4 is a diagram showing a BB' cross section of FIG. 3. The cross section of the LED element 15 will be described with reference to FIG. 4.

As shown in FIG. 4, an n-type semiconductor layer 33 is formed on the upper surface of a sapphire substrate 34, and a p-type semiconductor layer 32 is formed on the upper surface of the n-type semiconductor layer 33. A portion of the p-type semiconductor layer 32 is removed to expose a portion of the underlying n-type semiconductor layer 33. The protective layer 31, which covers the exposed portion of the n-type semiconductor layer 33 and the upper surface of the p-type semiconductor layer 32, has openings in regions thereof corresponding to the exposed portion of the n-type semiconductor layer 33 and a portion of the p-type semiconductor layer 32, and the N-side bump electrode 21 and the P-side bump electrode 22 are made to contact the n-type semiconductor layer 33 and the p-type semiconductor layer 32 through the respective openings. The N-side bump electrode 21 is formed by depositing an under-bump metal (UBM) layer 21c, a plated metal layer 21b, and a gold-tin eutectic layer 21a one on top of another. Similarly, the P-side bump electrode 22 is formed by depositing a UBM layer 22c, a plated metal layer 22b, and a gold-tin eutectic layer 22a one on top of another. In this patent specification, the chip composed of the protective layer 31, the semiconductor layers (p-type and n-type semiconductor layers 32 and 33), and the sapphire substrate 34 is referred to as the die 24.

The thickness of the sapphire substrate 34 is 200 to 300 μm, the thickness of the n-type semiconductor layer 33 is about 5 μm, and the thickness of the p-type semiconductor layer 32 is about 1 μm. The thicknesses of the N-side and P-side bump electrodes 21 and 22 are each 10 to 30 μm. The gold-tin eutectic layer 21a forming the top face of the N-side bump electrode 21 and the gold-tin eutectic layer 22a forming the top face of the P-side bump electrode 22 are each 2 to 3 μm thick. By causing the gold-tin eutectic layers 21a and 22a to melt, the LED element 15 are bonded to the negative electrode 14 and positive electrode 13 of the circuit substrate (gold-tin eutectic bonding). Since the melting point in the gold-tin eutectic bonding can be set to 300° C. to 420° C., when mounting the LED device 10 at a reflow temperature of about 250° C. the eutectic bonding portions can be maintained in a solid state. The gold-tin eutectic bonding is therefore a useful bonding method.

Figure 5:
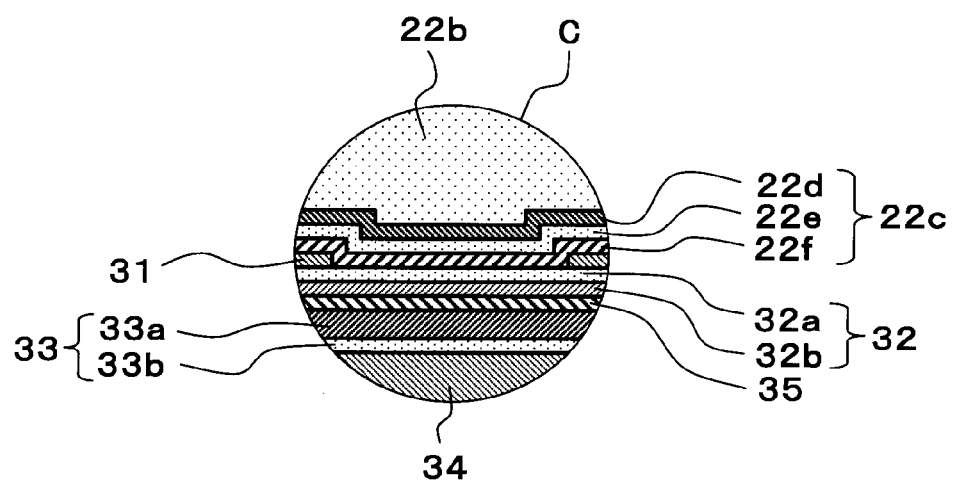
FIG. 5 is an enlarged view of a portion C in FIG. 4.

FIG. 5 is an enlarged view of a portion C in FIG. 4. The multilayered structure in the vicinity of the UBM layer 22c will be described in detail with reference to FIG. 5. Although the multilayered structure in the UBM layer 21C is not described, it is the same as the multilayered structure in the UBM layer 22c described in FIG. 5.

As shown in FIG. 5, a GaN buffer layer 33b and an n-type GaN layer 33a are formed one on top of the another on the sapphire substrate 34. Since the GaN buffer layer 33b and the n-type GaN layer 33a are identical in plan shape and formed in contacting relationship with each other, these layers are collectively referred to as the n-type semiconductor layer 33 in the following description. A light-emitting layer 35, a p-type GaN layer 32b, and a metal layer 32a are formed one on top of another on the n-type semiconductor layer 33. Since the p-type GaN layer 32b and the metal layer 32a are also identical in plan shape and formed in contacting relationship with each other, these layers are collectively referred to as the p-type semiconductor layer 32 in the following description.

The metal layer is often formed in a multilayered structure in order to improve the current distribution and achieve ohmic contact and atomic diffusion prevention. However, in the LED element 15, since the die 24 is originally intended for face-up mounting, the metal layer 32a is formed from a transparent ITO layer to make an ohmic contact with the p-type GaN layer 32b and to reduce electrical resistance. Here, in the opening formed in the protective layer 31 for wire bonding, the metal layer may be formed by depositing an atomic diffusion preventing layer of Ti or the like on top of the ITO layer.

The UBM layer 22c is disposed so as to cover the upper surface of the protective layer 31 and the opening formed in the protective layer 31. The UBM layer 22c is formed by depositing a TiW layer 22e and an Au layer 22d on top of an Al layer 22f (high-reflectivity metal layer). The Al layer 22f, the TiW layer 22e, and the Au layer 22d are each deposited to a thickness of about 100 nm. The plated metal layer 22b is formed on top of the UBM layer 22c. The material for the high-reflectivity metal layer need not be limited to Al, but Ag or an alloy thereof may be used. The high-reflectivity metal layer here means that its reflectivity is higher than the reflectivity of a commonly used plating electrode metal (TiW), and the reflectivity is preferably 90% or higher, and more preferably 95% or higher.

Figure 6:
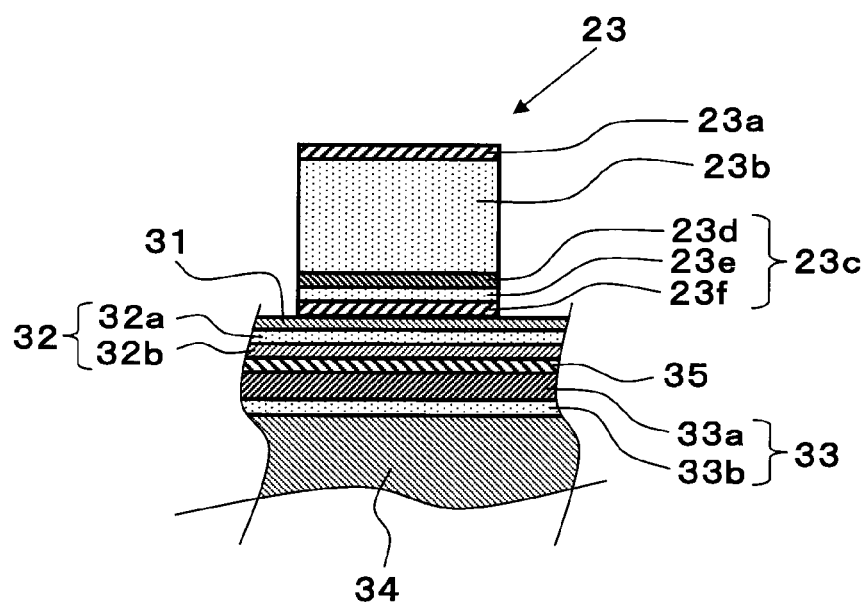
FIG. 6 is a cross-sectional view of a portion of a heat-sink bump 23.

FIG. 6 is a cross-sectional view of a portion of the heat-sink bump 23.

As shown in FIG. 6, the heat-sink bump 23 is formed on the protective layer 31 and, similarly to the N-side bump 21 and the P-side bump 22, comprises a gold-tin eutectic layer 23a, a plated metal layer 23b, and a UBM layer 23c. Here also, the UBM layer 23c is formed by depositing a TiW layer 23e and an Au layer 23d on top of an Al layer 23f (high-reflectivity metal layer). The structure of the heat-sink bump 25 is the same as that of the heat-sink bump 23 and, therefore, will not be described here. The LED element 15 is provided with the heat-sink bumps 23 and 25, but need not necessarily be provided with the heat-sink bumps.

Figure 7:
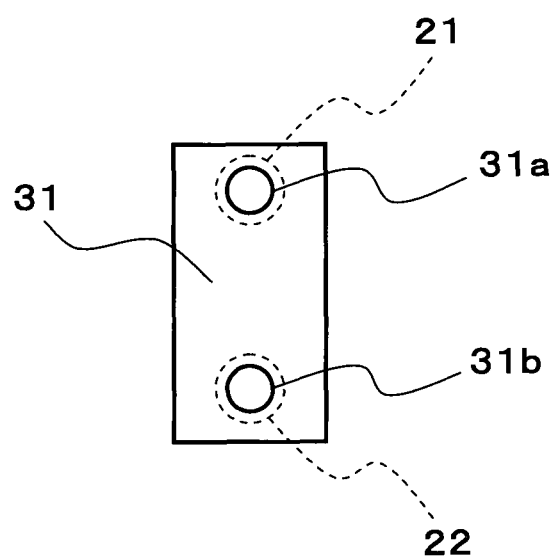
FIG. 7 is a diagram showing only a protective layer 31 as viewed from above a die 24.

FIG. 7 is a diagram showing only the protective layer 31 as viewed from above the die 24.

As shown in FIG. 7, the protective layer 31 is formed to cover the entire surface of the die 24, except the opening 31a for the N-side bump 21 and the opening 31b for the P-side bump 22. Further, the opening 31a for the N-side bump 21 and the opening 31b for the P-side bump 22 are formed slightly smaller than the diameters of the N-side bump 21 and the P-side bump 22, respectively. Since the heat-sink bumps 23 and 25 are formed on the protective layer 31 as described above, the protective layer 31 does not have openings for the heat-sink bumps.

Figure 8:
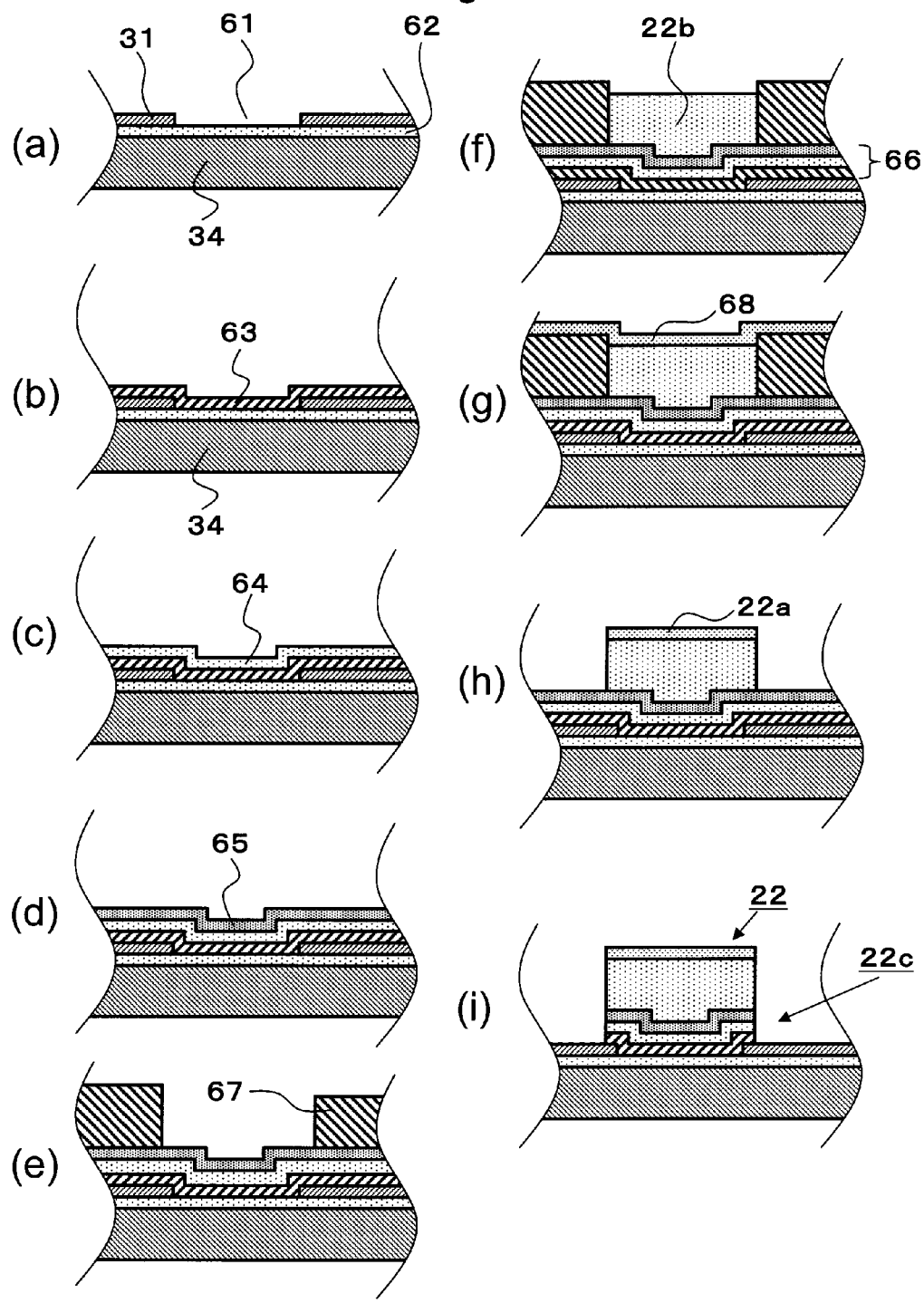
FIGS. 8(a) to 8(i) are diagrams showing a process sequence for bump formation for the LED element 15.

FIG. 8 is a diagram showing a process sequence for bump formation for the LED element 15.

The process diagrams of FIGS. 8(a) to 8(i) show only the cross section in the vicinity of the bump formation region in typical process steps. The bump formation steps will be described with reference to FIG. 8. In FIG. 8, the layered structure of the semiconductor layer 62 is omitted. The semiconductor layer 62 includes the p-type semiconductor layer 32, the light-emitting layer 35, and the n-type semiconductor layer 33.

First, the sapphire substrate 34 in the form of a wafer is prepared, and the semiconductor layer 62 is formed on the sapphire substrate 34; then, on top of that, the protective layer 31 having an opening corresponding to the bump formation region 61 is formed (see FIG. 8(a)). The wafer is cleaned in advance using a cleaning liquid, pure water, a brush, etc.

Next, an Al layer 63 is deposited by sputtering over the entire upper surface of the protective layer 31 and the opening 61 (see FIG. 8(b)). After that, a TiW layer 64 is deposited by sputtering over the entire upper surface of the Al layer 63 (see FIG. 8(c)). Further, an Au layer 65 is deposited by sputtering over the entire upper surface of the TiW layer 64 (see FIG. 8(d)).

Next, a resist 67 is formed everywhere except in the bump formation region 61 (see FIG. 8(e)). The resist material is applied by spin coating over the entire upper surface of the Au layer 65, followed by heat treatment. After that, a mask which is transparent only in the bump formation region 61 is placed above the resist material, and the resist material is exposed and developed to form the resist 67 as shown.

Next, the plated metal layer 22b is formed by electrolytic plating (see FIG. 8(f)). The plated metal layer 22b is formed by first immersing the sapphire substrate 34 in a gold plating solution and then flowing a current through the plating solution by utilizing the Al layer 63, TiW layer 64, and Au layer 65 as the negative plating electrode 66. The plated metal layer 22b is formed thinner than the resist 67.

Next, a gold-tin eutectic layer 68 is deposited by sputtering over the entire upper surface of the resist 67 and the plated metal layer 22b to a thickness of 1 to 2 μm (see FIG. 8(g)).

Next, the resist 67 is removed (see FIG. 8(h)). At this time, the gold-tin eutectic layer 68 is also removed everywhere except in the bump formation region 61, resulting in the formation of the gold-tin eutectic layer 22a on the plated metal layer 22b. After removing the resist 67, the surface is cleaned with pure water and dried by spinning.

Next, the plating electrode 66 (Al layer 63, TiW layer 64, and Au layer 65) is removed by etching (see FIG. 8(i)). In the etching, first the Au layer 65 is etched off in an iodine-based etching solution by using the plated metal layer 22b as a mask. Next, the TiW layer 64 is etched off in a hydrogen peroxide solution by using the plated metal layer 22b as a mask. Finally, the Al layer 63 is etched off in an etching solution of acetic acid by using the plated metal layer 22b as a mask. This results in the formation of the UBM layer 22c only below the plated metal layer 22b. The bump formation process is thus completed.

Figure 9:
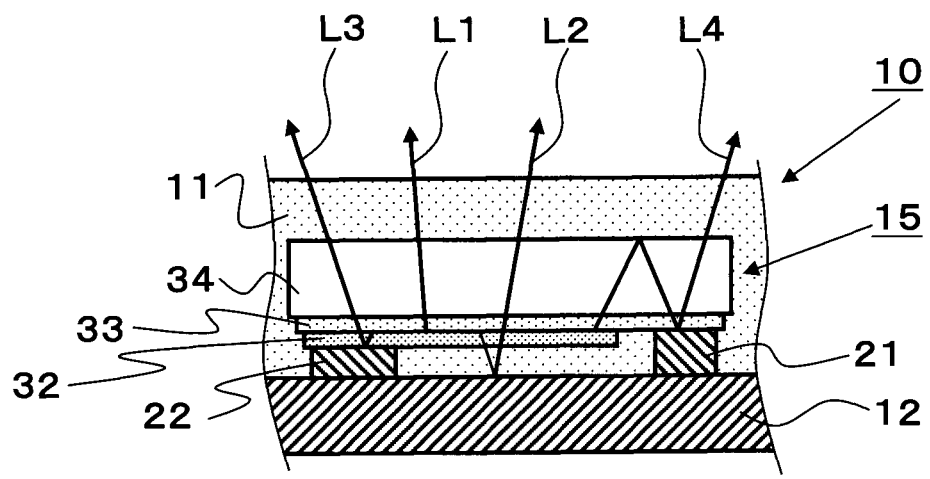
FIG. 9 is a diagram showing an AA' cross section of the LED device in FIG. 1.

FIG. 9 is a diagram showing an AA' cross section of the LED device 10 in FIG. 1. The light-emitting efficiency of the LED device 10 will be described with reference to FIG. 9.

As shown in FIG. 9, a light ray L1 shows how the light produced at the interface (the light-emitting layer) between the p-type semiconductor layer 32 and the n-type semiconductor layer 33 emerges from the LED device 10 by passing through the sapphire substrate 34 and the resin layer 11. A light ray L2 shows how the light produced at the light-emitting layer and directed toward the circuit substrate 12 is diffusely reflected by the alumina surface of the circuit substrate 12 and caused to emerge from the LED device 10.

A light ray L3 shows how the light produced at the light-emitting layer and directed toward the P-side bump electrode 22 is reflected by the Al layer 22f (not shown in FIG. 9) on the upper surface of the P-side bump electrode 22 and caused to emerge from the LED device 10. A light ray L4 shows how the light produced at the light-emitting layer and reflected by the upper surface of the sapphire substrate 34 toward the N-side bump electrode 21 is again reflected by the Al layer (not shown) on the upper surface of the N-side bump electrode 21 and caused to emerge from the LED device 10.

While the upper surface of the UBM layer according to the prior art has been formed, for example, from a low-reflectivity metal layer such as a TiW layer, the upper surface of the UBM layer 22c in the LED device 10 is provided with the Al layer 22f to ensure high reflectivity. This allows the light rays L3 and L4 to efficiently emerge from the LED device 10. Similarly to the N-side bump electrode 21 and the P-side bump electrode 22, the heat-sink bump 23 also (see FIG. 3) has an Al layer on the upper surface of the UBM layer, so that the light ray produced at the light-emitting layer and directed toward the heat-sink bump 23 is reflected by the Al layer on the upper surface of the UBM layer and caused to emerge from the LED device 10. Accordingly, the light-emitting efficiency of the LED device 10 improves by an amount equal to the amount by which the reflectivity of the area occupied by the N-side and P-side bump electrodes 21 and 22 and heat-sink bump 23 has improved.

In the LED device 10, the N-side and P-side bump electrodes 21 and 22 respectively include the plated metal layers 21b and 22b formed by electrolytic plating, and the plated metal layers 21b and 22b have been described as being gold bumps. The bump material (the material for the plated metal layers) need not be limited to gold, but use may be made, for example, of copper or nickel. However, the gold bumps offer the advantage of being able to ensure stability during reflow because the earlier described gold-tin eutectic bonding can be applied.

Since the plated metal layers 21b and 22b are formed by electrolytic plating, if the thickness is less than 3 μm, it is difficult to control the thickness, and the thickness may vary. Further, if the thickness is less than 10 μm, a sufficient gap cannot be provided between the LED device and the circuit substrate 12, resulting in increased susceptibility to the effects of dust adhering to the circuit substrate 12.

On the other hand, when the thickness is to be made greater than 30 μm, the fabrication process for growing the plated metal layers 21b and 22b takes a long time to complete, because they are formed by electrolytic plating. Further, to increase the thickness, there is a need to use a high-viscosity resist material, but the material is intractable.

In view of the above, the plated metal layers 21b and 22b in the LED element 15 are formed preferably to a thickness of 3 μm to 30 μm, and more preferably to a thickness of 10 μm to 30 μm. This also applies to an alternative LED element 15a and a further alternative LED element 15h to be described later.

If the wafer in which the face-up mounting die 24 is formed is used for flip-chip mounting by just forming the bump electrodes thereon, the reflectivity of the LED device decreases because of the lack of reflective layers on the electrode side. In view of this, a step for forming the reflective layers might be added in the wafer fabrication process. However, this would defeat the purpose of the present invention which aims to divert the face-up mounting die 24 for use as the flip-chip mounting LED element 15. That is, if a dedicated process had to be added, it would not be possible to fabricate the wafer in advance so that it could be used for face-up mounting or flip-chip mounting depending on the purpose.

Figure 10:
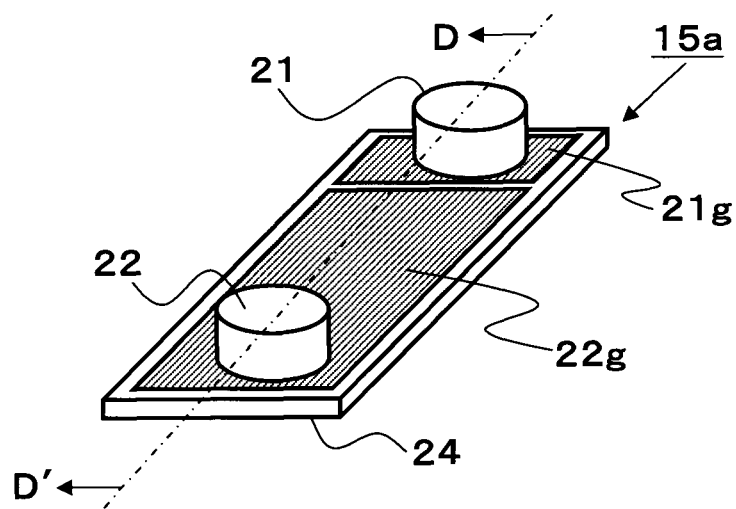
FIG. 10 is a perspective view showing an alternative LED element 15a as viewed from the bump side thereof.

FIG. 10 is a perspective view showing the alternative LED element 15a as viewed from the bump side thereof. The alternative LED element 15a of FIG. 10 may be used instead of the LED element 15 shown in FIG. 3, etc. for the LED device 10. The bump side of the alternative LED element 15a will be described with reference to FIG. 10.

As shown in FIG. 10, the N-side bump electrode 21 and the P-side bump electrode 22 are provided on the die 24 of the alternative LED element 15a. The major difference between the LED element 15 (see FIG. 3) and the alternative LED element 15a is that the UBM layers 21g and 22g in the alternative LED element 15a are formed so as to spread and extend over the edges of the regions occupied by the N-side bump electrode 21 and the P-side bump electrode 22, respectively. Otherwise, the structure of the alternative LED element 15a is the same as that of the LED element 15, and therefore, no further description will be given here. For convenience of illustration, the heat-sink bumps 23 and 25 are not shown in FIG. 10.

Figure 11:
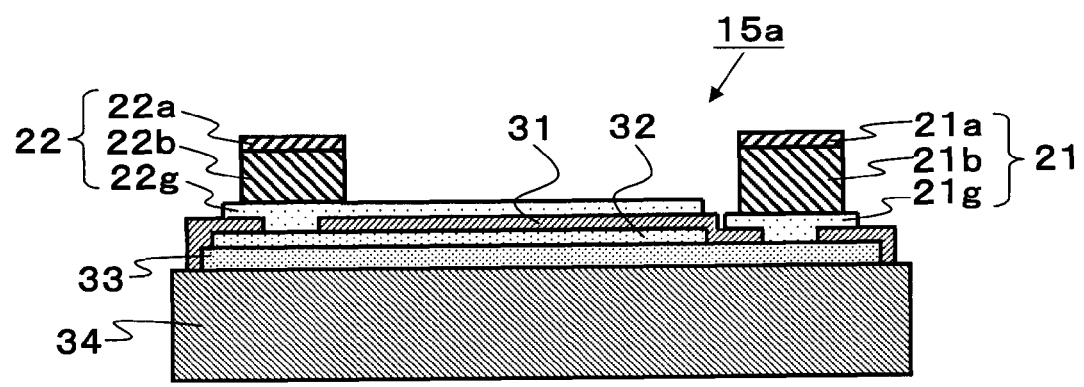
FIG. 11 is a diagram showing a DD' cross section of FIG. 10.

FIG. 11 is a diagram showing a DD' cross section of FIG. 10. The cross section of the alternative LED element 15a will be described with reference to FIG. 11.

The major difference between the cross section of the LED element 15 (see FIG. 4) and the cross section of the alternative LED element 15a is only that the UBM layers 21g and 22g in the alternative LED element 15a are formed so as to spread as shown. The UBM layers 21g and 22g in the alternative LED element 15a, like those in the LED element 15, are each formed by depositing an Al layer (not shown), a TiW layer (not shown), and an Au layer (not shown) one on top of another in this order when viewed from the side of the sapphire substrate 34.

The LED device 10 that uses the alternative LED element 15a also offers the advantage that the light rays emitted from the light-emitting layer and directed toward the circuit substrate 12 and the light rays reflected at various interfaces in the LED element 15a and directed toward the circuit substrate 12 are efficiently reflected by the UBM layers 21g and 22g and caused to emerge from the LED element 15a. The large reflecting faces (UBM layers 21g and 22g) provided in the alternative LED element 15a serve to eliminate the need to rely on the surface reflection of the circuit substrate 12. This allows the use of a material having low reflectivity but high thermal conductivity, such as aluminum nitride, as the material for the circuit substrate 12.

The UBM layers 21g and 22g are each formed by performing, after the step of exposing the plating electrode 66 in FIG. 8(h), the step of patterning the plating electrode 66 in the desired pattern by photolithography.

Figure 12:
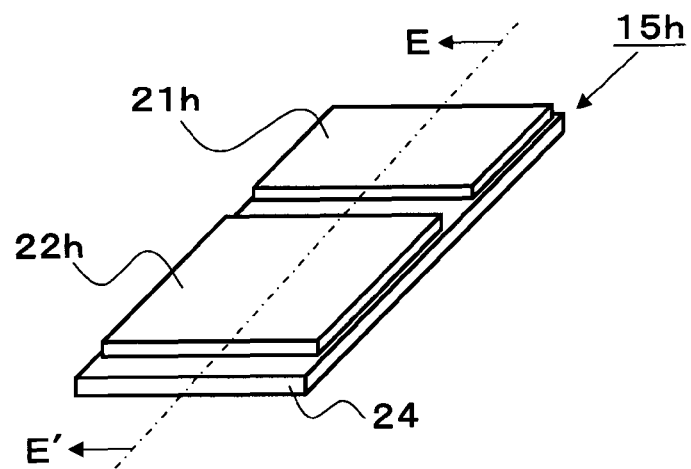
FIG. 12 is a perspective view showing a further alternative LED element 15h as viewed from the bump side thereof.

FIG. 12 is a perspective view showing the further alternative LED element 15h as viewed from the bump side thereof. The further alternative LED element 15h of FIG. 12 may be used instead of the LED element 15 shown in FIG. 3, etc., for the LED device 10. The bump side of the further alternative LED element 15h will be described with reference to FIG. 12.

As shown in FIG. 12, an N-side bump electrode 21h and a P-side bump electrode 22h are provided on the die 24 of the further alternative LED element 15h, and most of the upper surface of the die 24 is covered by the N-side and P-side bump electrodes 21h and 22h. The major difference between the LED element 15 (see FIG. 3) and the further alternative LED element 15h is only that the electrode configuration in the further alternative LED element 15h is different as just described. Otherwise, the structure of the further alternative LED element 15h is the same as that of the LED element 15, and therefore, no further description will be given here.

Figure 13:
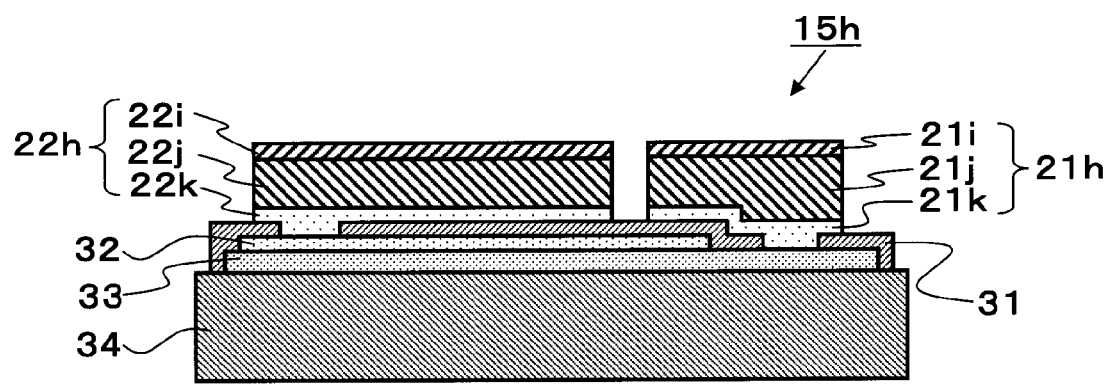
FIG. 13 is a diagram showing an EE' cross section of FIG. 12.

FIG. 13 is a diagram showing an EE' cross section of FIG. 12. The cross section of the further alternative LED element 15h will be described with reference to FIG. 13.

The major difference between the cross section of the LED element 15 (see FIG. 4) and the cross section of the further alternative LED element 15h is only that the N-side and P-side bump electrodes 21h and 22h in the further alternative LED element 15h are formed large enough to cover most of the upper surface of the further alternative LED element 15h. The N-side and P-side bump electrodes 21h and 22h in the further alternative LED element 15h are each formed by depositing a UBM layer 21k, 22k, a plated metal layer 21j, 22j, and a gold-tin eutectic layer 21i, 22i, one on top of another. The UBM layers 21k and 22k in the further alternative LED element 15h, like those in the LED element 15, are each formed by depositing an Al layer (not shown), a TiW layer (not shown), and an Au layer (not shown) one on top of another in this order when viewed from the side of the sapphire substrate 34.

The LED device 10 that uses the further alternative LED element 15h also offers the advantage that the light rays emitted from the light-emitting layer and directed toward the circuit substrate 12 and the light rays reflected at various interfaces in the further alternative LED element 15h and directed toward the circuit substrate 12 are efficiently reflected by the UBM layers 21k and 22k and caused to emerge from the further alternative LED element 15h. The large reflecting faces (UBM layers 21k and 22k) provided in the further alternative LED element 15h serve to eliminate the need to rely on the surface reflection of the circuit substrate 12. This allows the use of a material having low reflectivity but high thermal conductivity, such as aluminum nitride, as the material for the circuit substrate 12.

The UBM layers 21k and 22k can be formed by modifying the patterning step for forming the N-side and P-side bump electrodes 21 and 22 in the process of FIG. 8. That is, the further alternative LED element 15h takes advantage of the fact that the plan shapes of the N-side and P-side bump electrodes 21 and 22 can be set relatively freely because of the use of electrolytic plating. The further alternative LED element 15h has the additional advantage that, due to the shape of the N-side and P-side bump electrodes 21 and 22, the heat resistance from the light-emitting layer to the circuit substrate 12 is reduced and the heat-sinking characteristics improve. As a result, the further alternative LED element 15h can eliminate the need for the heat-sink bumps 23 provided in the LED element 15.

If a flip-chip mounting LED element having no reflective layers is provided, an LED element having a reflective layer can be easily produced by just forming a high-reflectivity metal layer as the lowermost layer of the plating electrode (also called the common electrode) indispensable to the electrolytic plating step. Accordingly, the present invention is also effective when adding a reflective layer in a flip-chip mounting LED element having no reflective layers.

What is claimed is:

1. A semiconductor light-emitting element for flip-chip mounting on a circuit substrate, comprising:
    a semiconductor layer including a light-emitting layer;
    a protective layer for protecting said semiconductor layer;
    a transparent material disposed between said light-emitting layer and said protective layer;
    an N-side bump electrode for connecting said semiconductor layer to said circuit substrate; and
    a P-side bump electrode for connecting said semiconductor layer to said circuit substrate,
    wherein:
        said N-side bump electrode and said P-side bump electrode each include an under-bump metal layer and an electrolytically plated metal layer;
        said under-bump metal layer includes a high-reflectivity metal layer disposed on a side that faces said semiconductor layer and a metal layer disposed on a side opposite from said semiconductor layer;
        said plated metal layer has a thickness not smaller than 3 μm but not larger than 30 μm; and
        said N-side bump electrode and said P-side bump electrode are disposed over said light-emitting layer.

2. The semiconductor light-emitting element according to claim 1, wherein said plated metal layer has a thickness not less than 10 μm but not greater than 30 μm.

3. The semiconductor light-emitting element according to claim 1, wherein said high-reflectivity metal layer is an Al layer or an Ag layer.

4. The semiconductor light-emitting element according to claim 1, wherein said N-side bump electrode and said P-side bump electrode have the same plan shape as said under-bump metal layers included in said N-side bump electrode and said P-side bump electrode, respectively.

5. The semiconductor light-emitting element according to claim 1, wherein said under-bump metal layer occupies an area larger than the area occupied by said plated metal layer.

6. The semiconductor light-emitting element according to claim 1, wherein said protective layer has openings formed therein, and said N-side bump electrode and said P-side bump electrode are respectively connected electrically to said semiconductor layer at said openings.

7. The semiconductor light-emitting element according to claim 1, wherein said N-side bump electrode is disposed so as to overlap with said light-emitting layer.

8. The semiconductor light-emitting element according to claim 1, wherein said metal layer is a metal layer for preventing atomic diffusion.

* * * * *